US009863302B2

(12) United States Patent
Higashino et al.

(10) Patent No.: US 9,863,302 B2
(45) Date of Patent: Jan. 9, 2018

(54) COOLING DEVICE FOR UNDER-FLOOR DEVICE FOR VEHICLE

(71) Applicants: Hiroyuki Higashino, Tokyo (JP); Yukio Nakashima, Tokyo (JP); Shigetoshi Ipposhi, Tokyo (JP)

(72) Inventors: Hiroyuki Higashino, Tokyo (JP); Yukio Nakashima, Tokyo (JP); Shigetoshi Ipposhi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 662 days.

(21) Appl. No.: 14/361,519

(22) PCT Filed: Nov. 22, 2012

(86) PCT No.: PCT/JP2012/080368
§ 371 (c)(1),
(2) Date: May 29, 2014

(87) PCT Pub. No.: WO2013/084729
PCT Pub. Date: Jun. 13, 2013

(65) Prior Publication Data
US 2014/0318736 A1  Oct. 30, 2014

(30) Foreign Application Priority Data

Dec. 9, 2011  (JP) ................................. 2011-270023

(51) Int. Cl.
*B60H 3/00* (2006.01)
*F01P 1/06* (2006.01)
(Continued)

(52) U.S. Cl.
CPC ................ *F01P 1/06* (2013.01); *B61C 17/00* (2013.01); *H05K 7/20918* (2013.01); *H05K 7/20936* (2013.01)

(58) Field of Classification Search
CPC ....... F01P 1/06; B61C 17/00; H05K 7/20918; H05K 7/20936
(Continued)

(56) References Cited

U.S. PATENT DOCUMENTS 1,564,742 A * 12/1925 Acker ................. F16H 57/0415
165/179
2,162,512 A * 6/1939 McPherson .......... B60H 1/3227
165/44

(Continued)

FOREIGN PATENT DOCUMENTS

CN  1625030 A  6/2005
JP  54-047217 A  4/1979
(Continued)

OTHER PUBLICATIONS

Office Action dated Jun. 19, 2015 in Korean Patent Application No. 10-2014-7015167 (with English translation).

(Continued)

*Primary Examiner* — Ljiljana Ciric
(74) *Attorney, Agent, or Firm* — Oblon, McClelland, Maier & Neustadt, L.L.P.

(57) ABSTRACT

A cooling device includes a base plate to a rear surface side of which an under-floor device is attached. A heat radiating unit is attached to a front surface side of the base plate and radiating heat is conducted from the under-floor device via the base plate. A cover surrounding the heat radiating unit and including a side opening is capable of causing traveling wind to flow therein and thereout, in opposite side surfaces facing a traveling direction of a vehicle. A guide plate guides traveling wind flowing in from the side opening to the heat radiating unit by blocking at least part of a gap area between a surface connecting the opposite side surfaces and the heat radiating unit, the guide plate being provided in a side gap (Continued)

area between a side surface of the cover and the heat radiating unit on a traveling-wind flow-in side.

12 Claims, 13 Drawing Sheets

(51) Int. Cl.
*B61C 17/00* (2006.01)
*H05K 7/20* (2006.01)

(58) Field of Classification Search
USPC .......................................................... 165/44
See application file for complete search history.

(56) References Cited

U.S. PATENT DOCUMENTS

| | | | | |
|---|---|---|---|---|
| 3,045,430 A * | 7/1962 | Becker | ................... | F16D 33/18 60/337 |
| 3,353,591 A * | 11/1967 | Zak | ..................... | F16H 57/0416 165/122 |
| 4,872,502 A * | 10/1989 | Holzman | ............ | F16H 57/0415 165/119 |
| 5,158,136 A * | 10/1992 | Azar | ....................... | F28F 1/124 165/185 |
| 5,651,414 A | 7/1997 | Suzuki et al. | | |
| 5,789,833 A * | 8/1998 | Kinoshita | ................ | B61C 9/50 310/58 |
| 5,800,942 A * | 9/1998 | Hamada | ................... | B60K 1/04 429/120 |
| 5,927,384 A * | 7/1999 | Waldner, Jr. | ........... | B60K 17/16 165/121 |
| 5,931,217 A * | 8/1999 | Fernstrum | ............... | F28D 1/022 165/41 |
| 6,544,085 B1 * | 4/2003 | Menard | ................... | B63H 21/10 165/41 |
| 6,575,227 B1 * | 6/2003 | Leeson | ................... | F28D 1/022 165/173 |
| 6,688,383 B1 * | 2/2004 | Sommer | ............ | F16H 57/0412 123/41.34 |
| 6,896,037 B2 * | 5/2005 | Leeson | ................. | B63H 21/10 165/173 |
| 6,997,238 B1 * | 2/2006 | Ruthy | ................. | F16H 57/0417 165/41 |
| 7,044,194 B2 * | 5/2006 | Leeson | ................... | F01P 3/207 165/173 |
| 7,055,576 B2 * | 6/2006 | Fernstrum | ................. | B63B 3/38 165/173 |
| 7,823,671 B2 * | 11/2010 | Inoue | ..................... | B60K 11/02 180/68.1 |
| 8,196,708 B2 * | 6/2012 | Kung | ................... | F04B 43/06 184/27.4 |
| 8,210,301 B2 * | 7/2012 | Hashimoto | ............. | B60K 1/04 180/68.5 |
| 8,376,029 B2 * | 2/2013 | Rericha | ................... | B63H 21/10 165/153 |
| 8,387,733 B2 * | 3/2013 | Nakamura | ............... | B60K 1/04 180/68.1 |
| 8,459,387 B2 * | 6/2013 | Field | ................... | B66F 9/07595 180/68.1 |
| 8,464,817 B2 * | 6/2013 | Usami | ..................... | B60K 1/04 180/68.5 |
| 8,505,662 B2 * | 8/2013 | Schwarz | ................. | B60R 16/04 180/68.5 |
| 8,544,454 B2 * | 10/2013 | Geskes | .................... | F28D 7/06 123/568.11 |
| 8,714,477 B2 * | 5/2014 | Rinjonneau | ................ | B64D 33/10 165/41 |
| 8,715,127 B2 * | 5/2014 | Beutler | ................. | B60B 35/163 475/161 |
| 8,813,832 B2 * | 8/2014 | Miki | ....................... | B61C 17/00 165/182 |
| 8,833,193 B2 * | 9/2014 | Strauβ | ................ | F16H 57/0447 184/6.12 |
| 8,967,334 B2 * | 3/2015 | Strauβ | ................ | F16H 57/0447 184/6.12 |
| 8,973,458 B2 * | 3/2015 | Strauβ | ................ | F16H 57/0447 184/6.12 |
| 9,077,057 B2 * | 7/2015 | Horii | ......................... | B60K 1/04 |
| 2001/0017498 A1 * | 8/2001 | Matsuoka | ............ | H02K 5/1732 310/90 |
| 2001/0046624 A1 * | 11/2001 | Goto | ..................... | H01M 2/105 429/99 |
| 2004/0150270 A1 * | 8/2004 | Nagayama | ................ | H02K 1/32 310/61 |
| 2005/0153199 A1 * | 7/2005 | Yagi | ...................... | H01M 2/105 429/148 |
| 2005/0170239 A1 * | 8/2005 | Uemoto | .............. | H01M 10/625 429/120 |
| 2005/0202311 A1 * | 9/2005 | Higashino | ........... | H01M 2/1077 429/99 |
| 2005/0231158 A1 * | 10/2005 | Higashino | ........... | H01M 2/1077 320/112 |
| 2006/0028075 A1 * | 2/2006 | Noda | ....................... | H02K 5/10 310/64 |
| 2006/0141353 A1 * | 6/2006 | Watanabe | ........... | H01M 2/1077 429/148 |
| 2006/0172187 A1 * | 8/2006 | Ambrosio | ........... | H01M 2/1077 429/120 |
| 2007/0273220 A1 * | 11/2007 | Koyama | ................... | H02K 5/20 310/58 |
| 2008/0030086 A1 * | 2/2008 | Noda | ........................ | B61C 9/50 310/57 |
| 2008/0062622 A1 * | 3/2008 | Fukazu | .................... | B60K 1/04 361/678 |
| 2009/0020261 A1 * | 1/2009 | McMillan | .............. | F01M 5/002 165/44 |
| 2009/0145592 A1 * | 6/2009 | Leitch | ...................... | B60S 1/487 165/185 |
| 2009/0317692 A1 * | 12/2009 | Matsumoto | ............ | B60K 11/06 429/415 |
| 2009/0320715 A1 * | 12/2009 | Morita | ..................... | B60K 1/04 105/51 |
| 2010/0231035 A1 * | 9/2010 | Tsuchiya | ............ | B60H 1/00278 307/9.1 |
| 2011/0272127 A1 * | 11/2011 | Melo | ..................... | F28D 9/0062 165/185 |
| 2013/0312937 A1 * | 11/2013 | Tsukinari | .............. | H01L 23/427 165/104.21 |

FOREIGN PATENT DOCUMENTS

| | | |
|---|---|---|
| JP | 54-065909 A | 5/1979 |
| JP | 54-140405 U | 9/1979 |
| JP | 55-047749 U | 3/1980 |
| JP | 58-020541 U | 2/1983 |
| JP | 62-016554 U | 1/1987 |
| JP | 04-035254 Y2 | 8/1992 |
| JP | 07-190655 A | 7/1995 |
| JP | 10-258738 A | 9/1998 |
| JP | 11-189153 A | 7/1999 |
| JP | 2000-092819 A | 3/2000 |
| JP | 2001-118976 A | 4/2001 |
| JP | 2005-053330 A | 3/2005 |
| JP | 2005-123459 A | 5/2005 |
| JP | 2006-240614 A | 9/2006 |
| JP | 2012-017103 A | 1/2012 |
| JP | 2012-166693 A | 9/2012 |
| KR | 10-2005-0037374 | 4/2005 |

OTHER PUBLICATIONS

International Search Report dated Jan. 8, 2013 in PCT/JP2012/080368.
Combined Office Action and Search Report dated Nov. 2, 2015 in Chinese Patent Application No. 201280060081.3 with partial English translation and English translation of category of cited documents.

(56) References Cited

OTHER PUBLICATIONS

Extended European Search Report dated Aug. 3, 2015 in Patent Application No. 12854752.8.

* cited by examiner

PRIOR ART

PRIOR ART

PRIOR ART

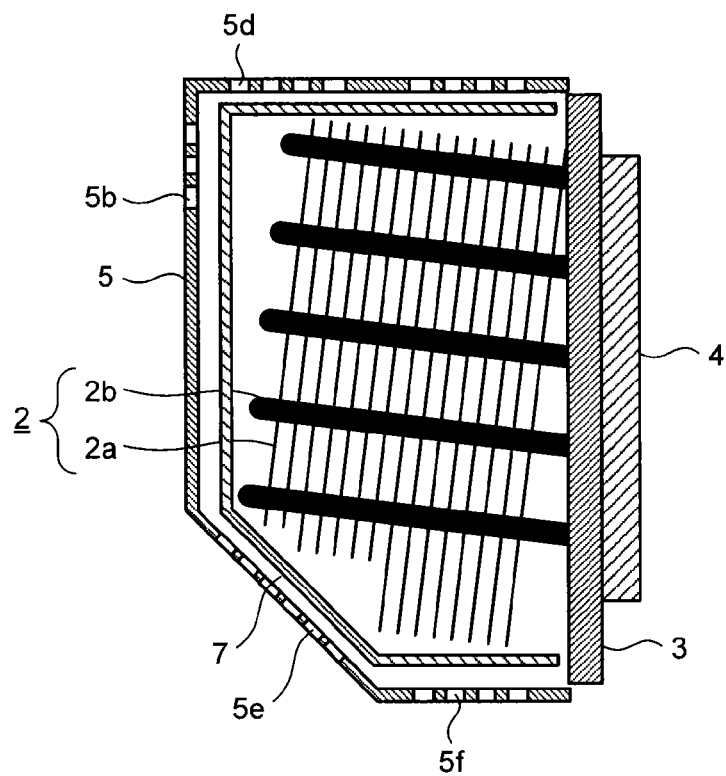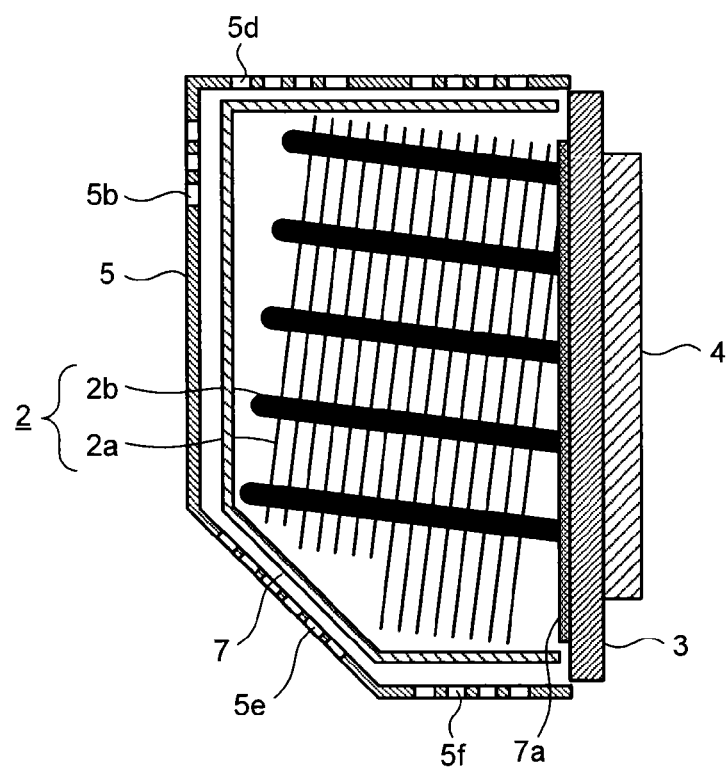

COOLING DEVICE FOR UNDER-FLOOR DEVICE FOR VEHICLE

FIELD

The present invention relates to a cooling device for an under-floor device for a vehicle that cools a device installed under a floor of a vehicle.

BACKGROUND

An under-floor device for a vehicle installed under a floor of a railway vehicle is naturally cooled when the vehicle is stopped and is cooled by using a traveling wind when the vehicle is traveling. Therefore, in order to perform highly efficient cooling of an under-floor device for a vehicle, it is necessary to have a structure with which a natural cooling airflow is not disturbed and a traveling wind can be efficiently taken in.

For example, Patent Literature 1 discloses a cooling method of a reactor using a guide for efficiently taking in a wind. Furthermore, Patent Literature 2 discloses a cooler using a U-shaped cooling pipe, in which a baffle plate is provided around the U-shaped cooling pipe.

CITATION LIST

Patent Literatures

Patent Literature 1: Japanese Utility Model Laid-open Publication No. S55-47749
Patent Literature 2: Japanese Patent Application Laid-open No. H11-189153

SUMMARY

Technical Problem

However, in Patent Literature 1, there is a problem in that because the outer periphery of a cylindrical winding to be cooled is covered, the pressure loss increases; therefore, the air-flow rate decreases to deteriorate the cooling performance. Furthermore, according to this cooling method, because the outer periphery of the cylindrical winding to be cooled is covered, the cooling efficiency when the vehicle is stopped is very poor.

Further, in Patent Literature 2, there is a problem in that almost all the traveling wind flows to the penetration portion of the U-shaped cooling pipe and the traveling wind does not flow to the cooling pipe. If a baffle plate is installed in the penetration portion, the pressure loss increases and the traveling wind hardly flows to the cooling pipe. Further, in the attached state of the baffle plate, a flow by natural convection that flows from the lower side to the upper side of the U-shaped cooling pipe when the vehicle is stopped is disturbed. Therefore, the cooling capacity when the vehicle is stopped decreases. In addition, generally, a cover for protecting a cooler from a flying gravel or the like is provided to the cooler arranged under the floor, which is not shown in Patent Literature 2. If such a cover is provided to the cooler in Patent Literature 2, there is a problem in that a gap is generally formed between the cover and the cooler due to a tolerance of machining accuracy of components or the like, and part of the traveling wind flowing to the inside of the cover flows to the gap, thereby deteriorating the cooling performance.

The present invention has been achieved in view of the above and an object of the present invention is to provide a cooling device for an under-floor device for a vehicle that can efficiently take in a traveling wind to the cooling device installed under the floor of the vehicle and has excellent cooling capacity.

Solution to Problem

In order to solve the above problems and achieve the object, a cooling device for an under-floor device for a vehicle according to the present invention is a cooling device for an under-floor device for a vehicle that is arranged under a floor of a vehicle and that cools an under-floor device arranged under the floor of the vehicle by using a traveling wind generated by traveling of the vehicle as a cooling wind, the device includes a base plate to a rear surface side of which the under-floor device is attached; a heat radiating unit that is attached to a front surface side of the base plate and radiates heat conducted from the under-floor device via the base plate; a cover that surrounds the heat radiating unit and includes a side opening capable of causing the traveling wind to flow therein and causing a traveling wind flown therein to flow out, in opposite side surfaces facing a traveling direction of the vehicle; and an guide plate that guides a traveling wind flowing in from the side opening to the heat radiating unit by blocking at least part of a gap area between a surface connecting the opposite side surfaces of the cover and the heat radiating unit, the guide plate being provided in a side gap area between a side surface of the cover and the heat radiating unit on a side from which the traveling wind flows in.

Advantageous Effects of Invention

According to the present invention, an effect is obtained where it is possible to obtain the cooling device for an under-floor device for a vehicle that can efficiently take in a traveling wind to the cooling device installed under the floor of the vehicle and has excellent cooling capacity capable of performing highly efficient cooling on a member to be cooled, such as an electronic device.

BRIEF DESCRIPTION OF DRAWINGS

FIG. 1-2 is a longitudinal sectional view taken along line A-A in FIG. 1-1, depicting a schematic configuration of the cooling device for an under-floor device for a vehicle according to the first embodiment of the present invention.

FIG. 1-3 is a longitudinal sectional view taken along line B-B in FIG. 1-1, depicting a schematic configuration of the cooling device for an under-floor device for a vehicle according to the first embodiment of the present invention.

FIG. 1-4 is a transverse sectional view taken along line C-C in FIG. 1-1, depicting a schematic configuration of the cooling device for an under-floor device for a vehicle according to the first embodiment of the present invention.

FIG. 2-1 is a perspective view of a schematic configuration of a conventional cooling device for an under-floor device for a vehicle.

FIG. 2-2 is a longitudinal sectional view taken along line D-D in FIG. 2-1, depicting a schematic configuration of the conventional cooling device for an under-floor device for a vehicle.

FIG. 2-3 is a longitudinal sectional view taken along line E-E in FIG. 2-1, depicting a schematic configuration of the conventional cooling device for an under-floor device for a vehicle.

FIG. 2-4 is a transverse sectional view taken along line F-F in FIG. 2-1, depicting a schematic configuration of the conventional cooling device for an under-floor device for a vehicle.

FIG. 3-1 is a longitudinal sectional view corresponding to FIG. 1-3, depicting a schematic configuration of a cooling device for an under-floor device for a vehicle according to a second embodiment of the present invention.

FIG. 3-2 is a transverse sectional view corresponding to FIG. 1-4, depicting a schematic configuration of the cooling device for an under-floor device for a vehicle according to the second embodiment of the present invention.

FIG. 4-1 is a longitudinal sectional view corresponding to FIG. 1-3, depicting a schematic configuration of a cooling device for an under-floor device for a vehicle according to a third embodiment of the present invention.

FIG. 4-2 is a transverse cross sectional view corresponding to FIG. 1-4, depicting a schematic configuration of the cooling device for an under-floor device for a vehicle according to the third embodiment of the present invention.

FIG. 5-1 is a longitudinal sectional view corresponding to FIG. 1-2, depicting a schematic configuration of a cooling device for an under-floor device for a vehicle according to a fourth embodiment of the present invention.

FIG. 5-2 is a transverse cross sectional view corresponding to FIG. 1-4, depicting a schematic configuration of the cooling device for an under-floor device for a vehicle according to the fourth embodiment of the present invention.

FIG. 8-1 is a longitudinal sectional view corresponding to FIG. 1-3, depicting a modification of a guide plate according to the present invention.

FIG. 8-2 is a longitudinal cross sectional view corresponding to FIG. 1-3, depicting a modification of the guide plate according to the present invention.

FIG. 9-1 is a longitudinal sectional view corresponding to FIG. 1-3, depicting a modification of the guide plate according to the present invention.

FIG. 9-2 is a longitudinal sectional view corresponding to FIG. 1-3, depicting a modification of the guide plate according to the present invention.

DESCRIPTION OF EMBODIMENTS

Figure 1:
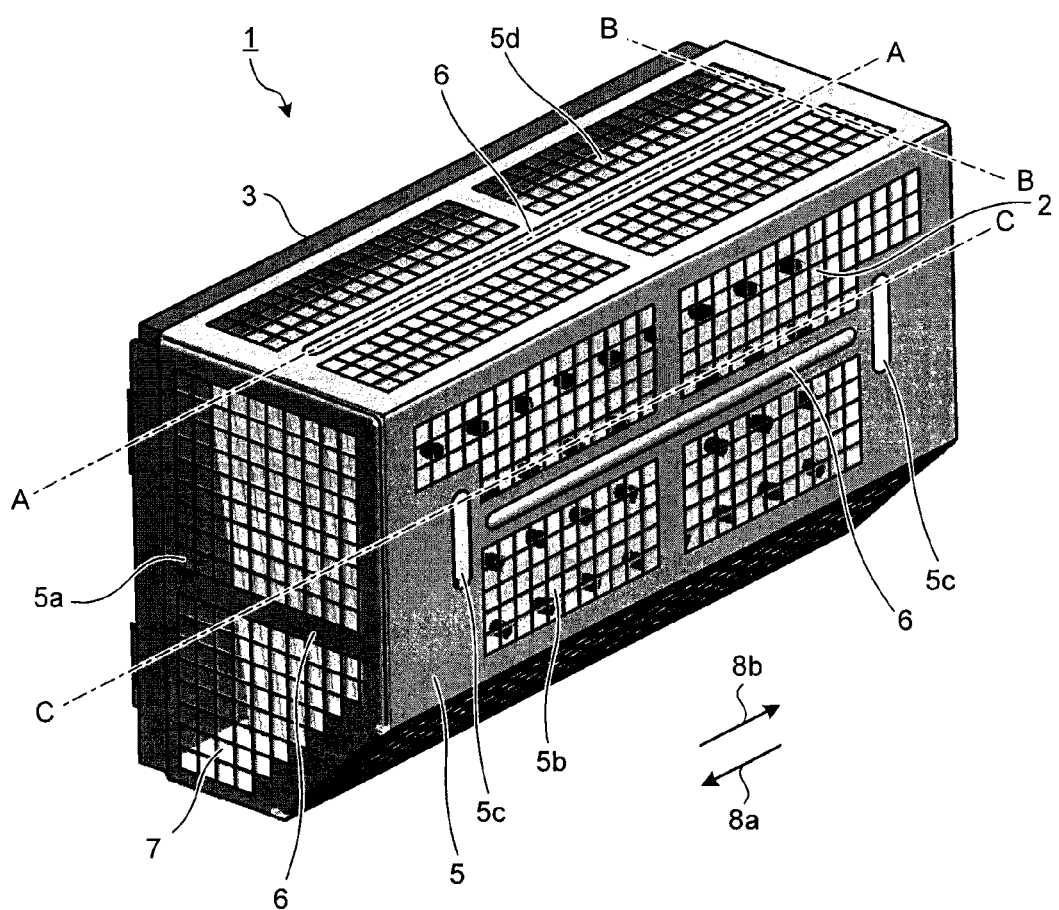
FIG. 1-1 is a perspective view of a schematic configuration of a cooling device for an under-floor device for a vehicle according to a first embodiment of the present invention.

Exemplary embodiments of a cooling device for an under-floor device for a vehicle according to the present invention will be explained below in detail with reference to the drawings. The present invention is not limited to the following description and can be modified as appropriate without departing from the scope of the present invention. In the drawings explained below, for easier understanding, scales of respective members may be shown differently from actual scales. This holds true for the relationships between the drawings.

First Embodiment

Figures 1, 2:
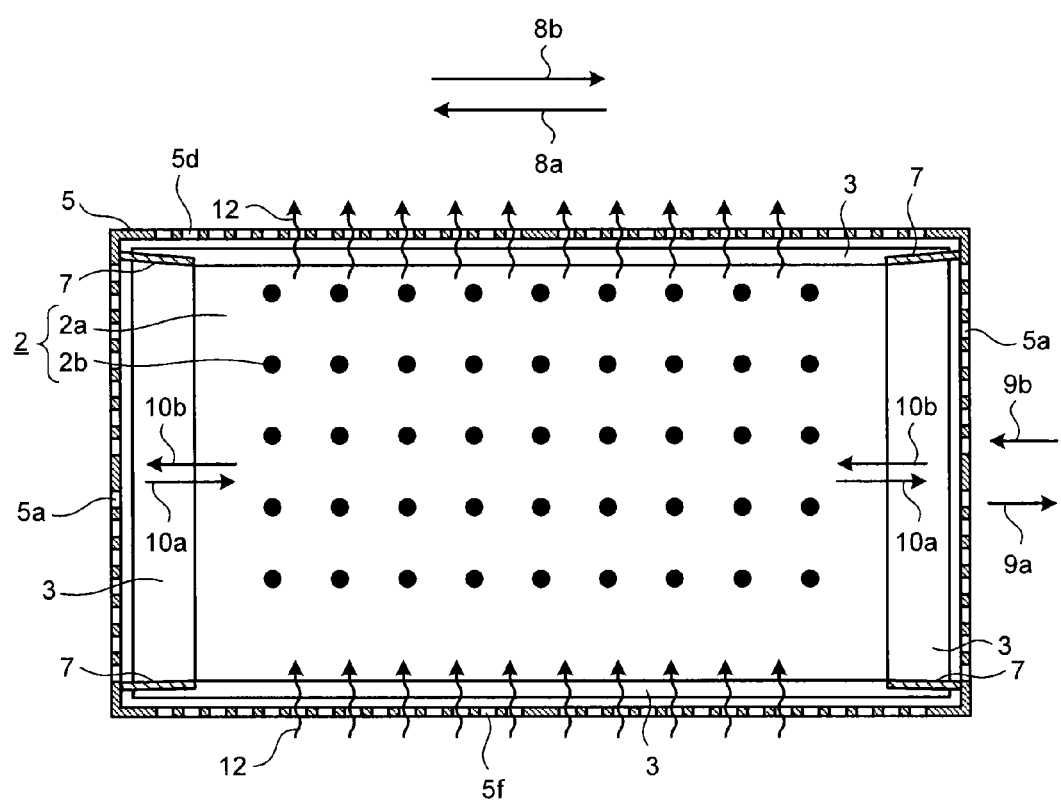
Figures 1, 2, 3:
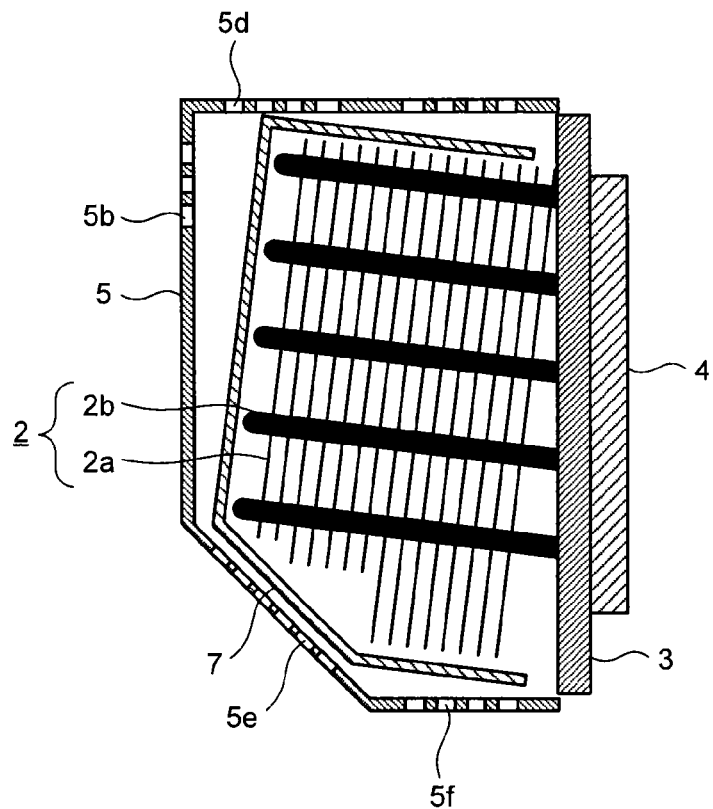

FIGS. 1-1 to 1-4 depict a schematic configuration of a cooling device 1 for an under-floor device for a vehicle according to a first embodiment of the present invention. FIG. 1-1 is a perspective view, FIG. 1-2 is a longitudinal sectional view taken along line A-A in FIG. 1-1, FIG. 1-3 is a longitudinal sectional view taken along line B-B in FIG. 1-1, and FIG. 1-4 is a transverse cross sectional view taken along line C-C in FIG. 1-1. The cooling device 1 for an under-floor device for a vehicle is a cooling device for an under-floor device for a vehicle that is arranged under the floor of the vehicle to cool the under-floor device arranged under the floor of the vehicle by using a traveling wind generated by traveling of a vehicle as a cooling wind.

In the cooling device 1 for an under-floor device for a vehicle according to the first embodiment, an electronic component 4 as an under-floor device being a member to be cooled is attached to the rear surface side of a base plate 3 as a heat-conducting plate, and a cooler 2 being a heat radiating unit is attached to the front surface (the surface opposite to the surface to which the electronic component 4 is attached) side of the base plate 3. A cover 5 is attached to the front surface side of the base plate 3 to cover the cooler 2.

The cooler 2 includes a plurality of heat conducting bars 2b provided to protrude toward the front surface side of the base plate 3, and a plurality of plate-like fins 2a having a substantially rectangular shape fixed to the heat conducting bars 2b. The heat conducting bars 2b are arranged in a matrix on the other surface side of the base plate 3 in a state of protruding with a predetermined angle with respect to the planar direction of the base plate 3. The fins 2a each include a plurality of through holes provided corresponding to the array on the base plate 3. The heat conducting bars 2b are inserted into the through holes such that the fins 2a are fixed at predetermined intervals in the extending direction of the heat conducting bars 2b in a state where the main surfaces thereof are inclined at a predetermined angle with respect to the planar direction of the base plate 3. The fins 2a and the heat conducting bars 2b are made of a material having high heat conductivity.

A side opening 5a having a plurality of openings arranged substantially in a matrix is provided in one side and the other side of the cover 5. The side opening 5a is divided into a plurality of areas by a rib 6. A front opening 5b having a plurality of openings arranged substantially in a matrix is provided in the front surface of the cover 5. The front opening 5b is divided into a plurality of areas by the rib 6. Partially large openings 5c are provided in the front surface of the cover 5. In the cover 5, the surface arranged substantially vertical to the traveling direction of the vehicle (a traveling direction 8a or a traveling direction 8b) is referred to as a side surface, and the surface substantially parallel to the traveling direction of the vehicle (the traveling direction 8a or the traveling direction 8b) and opposite to the base plate 3 is referred to as a front surface.

A top opening 5d having a plurality of openings arranged substantially in a matrix is provided in the top surface of the cover 5. The top opening 5d is divided into a plurality of areas by the rib 6. The lower part of the front surface of the cover 5 is an inclined surface inclined to the direction of the base plate 3 as going downward, and the inclined surface is provided with a slant opening 5e having a plurality of openings arranged substantially in a matrix. The slant opening 5e is divided into a plurality of areas by the rib 6. An underside opening 5f having a plurality of openings arranged substantially in a matrix is provided in the bottom surface of the cover 5. The underside opening 5f is divided into a plurality of areas by a rib (not shown). The cooling device 1 for an under-floor device for a vehicle as described above is fixed under the floor of a railway vehicle via an attachment member (not shown).

The cooling device 1 for an under-floor device for a vehicle cools the electronic component 4 by using part of the traveling wind generated by traveling of the vehicle as a cooling wind. Therefore, the side openings 5a described above are provided in the opposite side surfaces in the traveling direction of the vehicle. In the traveling direction of the vehicle (the traveling direction 8a or the traveling direction 8b), the side opening 5a on the forward side becomes an inlet for introducing the cooling wind into the cooling device 1 for an under-floor device for a vehicle, and the side opening 5a on the backward side becomes an outlet for discharging the cooling wind introduced into the cooling device 1 for an under-floor device for a vehicle.

A cooling operation of the cooling device 1 for an under-floor device for a vehicle configured as above is explained. Heat generated in the electronic component 4 is conducted via the base plate and is transported to the cooler 2. That is, heat generated in the electronic component 4 is transported to the fins 2a via the base plate 3 and the heat conducting bars 2b. Therefore, the temperature in the cooler 2 is generally higher than the outside air temperature. Because the fins 2a are formed in the cooler 2, when air (cooling wind) passes through the inside of the cooler 2, heat exchange is performed between the fins 2a and the air. The form of the fins 2a is not particularly limited to a plate-like shape. Aluminum is generally used as a material of the fins 2a; however, the material is not particularly limited as long as the material has high heat conductivity.

When the vehicle is traveling, after the cooling wind introduced from the side opening 5a being the inlet is guided to the cooler 2 to cool the fins 2a and the heat conducting bars 2b attached to the base plate 3, the cooling wind is discharged from the side opening 5a being the outlet. When the traveling direction of the vehicle is changed, the flow of the cooling wind also becomes an opposite direction, and the definition of the inlet and the outlet is reversed.

Meanwhile, when the vehicle is stopped, there is no traveling wind. However, in this case, the fins 2a and the heat conducting bars 2b are naturally cooled by a natural wind 12 that is the air passing through the cooler 2 in the cooling device 1 for an under-floor device for a vehicle from the underside opening 5f in the bottom surface of the cover 5 and flowing to the outside from the top opening 5d in the top surface of the cover 5.

Generally, there is a gap between the cover and the cooler due to a tolerance of machining accuracy of the components or the like. In this case, part of a traveling wind 9 (a traveling wind 9a or a traveling wind 9b) introduced into the cooling device 1 for an under-floor device for a vehicle from the side opening 5a being the inlet when the vehicle is traveling becomes a main flow 10 (a main flow 10a or a main flow 10b), which is the cooling wind flowing toward the cooler 2. However, the other part of the traveling wind 9 becomes a bypass flow that is diverted to flow into a gap area between the surfaces connecting the opposite side surfaces of the cover 5 and the cooler 2. Arrow directions in FIGS. 1-1 to 1-4 indicate the flow directions of respective winds.

That is, when the traveling direction of the vehicle is the traveling direction 8a, the traveling wind is the traveling wind 9a in the opposite direction to the traveling direction 8a of the vehicle, the cooling wind flowing toward the cooler 2 is the main flow 10a in the opposite direction to the traveling direction 8a of the vehicle, and the bypass flow is the bypass flow flowing in the opposite direction to the traveling direction 8a of the vehicle. When the traveling direction of the vehicle is the traveling direction 8b, the traveling wind is the traveling wind 9b in the opposite direction to the traveling direction 8b of the vehicle, the cooling wind flowing toward the cooler 2 is the main flow 10b in the opposite direction to the traveling direction 8b of the vehicle, and the bypass flow is the bypass flow flowing in the opposite direction to the traveling direction 8b of the vehicle. When such bypass flows are generated, the air volume of the cooling wind decreases; therefore, the cooling performance for cooling the fins 2a and the heat conducting bars 2b deteriorates.

Therefore, in the cooling device 1 for an under-floor device for a vehicle according to the first embodiment, a guide plate 7 is attached to the side gap area between the side surface of the cover 5 being the inlet and the cooler 2. The guide plate 7 blocks at least part of the gap area between the surfaces connecting the opposite side surfaces of the cover 5 and the cooler 2 to guide the traveling wind flowing from the side opening 5a to the cooler 2, near the opposite side surfaces of the cover 5.

In the cooling device 1 for an under-floor device for a vehicle, the guide plate 7 is provided substantially in a C-shape to block the area excluding the rear surface side (the base plate 3 side) in the surface vertical to the traveling direction of the vehicle (the traveling direction 8a or the traveling direction 8b), in the gap area between the surfaces connecting the opposite side surfaces (the top surface, the surface on the front surface side, and the bottom surface of the cover 5) and the cooler 2. That is, the guide plate 7 has a substantially C-shape arranged on the top side, the front surface side, and the bottom side of the side gap area. One end of the guide plate 7 on the cooler 2 side is connected to near the corner portion on the side opening 5a side of the outer peripheral portion of the cooler 2. The other end on the side surface side of the guide plate 7 is connected to the side surface of the cover 5 along a direction excluding the rear surface side of the outermost periphery of the side opening 5a on the side surface in order to use the traveling wind efficiently.

The guide plate 7 described above linearly connects the side surface of the cover 5 with the cooler 2. In the traveling direction of the vehicle (the traveling direction 8a or the traveling direction 8b), the guide plate 7 has a shape that does not completely cover the cooler 2. According to the first embodiment, it is preferable that there is no gap between the guide plate 7 and the base plate 3. However, there may be a gap of about a fin pitch.

According to the cooling device 1 for an under-floor device for a vehicle that includes the guide plate 7 as described above, the traveling wind flowing near the side gap area between the side surface of the cover 5 and the cooler 2 is guided by the guide plate 7, and flows to the cooler 2 without being diverted to the gap area between the top surface, the surface on the front surface side, or the bottom surface of the cover 5 and the cooler 2. Therefore, most of the traveling wind taken in from the side opening 5a when the vehicle is traveling flows to the cooler 2 without being diverted to the gap area between the top surface, the surface on the front surface side, or the bottom surface of the cover 5 and the cooler 2; therefore, the air volume of the cooling wind increases. Accordingly, the electronic component 4 can be efficiently cooled by efficiently cooling the fins 2a and the heat conducting bars 2b. The guide plate 7 is provided here substantially in a C-shape. However, by blocking at least part of the gap area between the top surface, the surface on the front surface side, or the bottom surface of the cover 5 and the cooler 2 with the guide plate 7 in a plane vertical to the traveling direction (the traveling direction 8a or the traveling direction 8b) of the vehicle, the same effect can be acquired. However, in order to acquire a sufficient effect, it is preferable to arrange the guide plate 7 as wide as possible.

The guide plate 7 does not completely cover the cooler 2, and the top and bottom surfaces of the cooler 2 are not covered with the guide plate 7. Therefore, the guide plate 7 does not block the airflow flowing from the bottom surface to the top surface of the cover 5, and natural cooling of the cooler 2 by the natural wind 12 when the vehicle is stopped is not hindered. Accordingly, the guide plate 7 does not reduce the cooling capacity when the vehicle is stopped.

In manufacturing the cooling device 1 for an under-floor device for a vehicle, the guide plate 7 having such a configuration can be attached to the cover 5 beforehand and then fixed to the cooler 2, thereby facilitating attachment thereof. By having a structure in which the guide plate 7 is fixed to the cover 5 beforehand, it is possible to obtain a structure in which there is no gap between the cover 5 and the guide plate 7, thereby enabling the traveling wind to be efficiently guided.

Figures 1, 2, 3, 4:
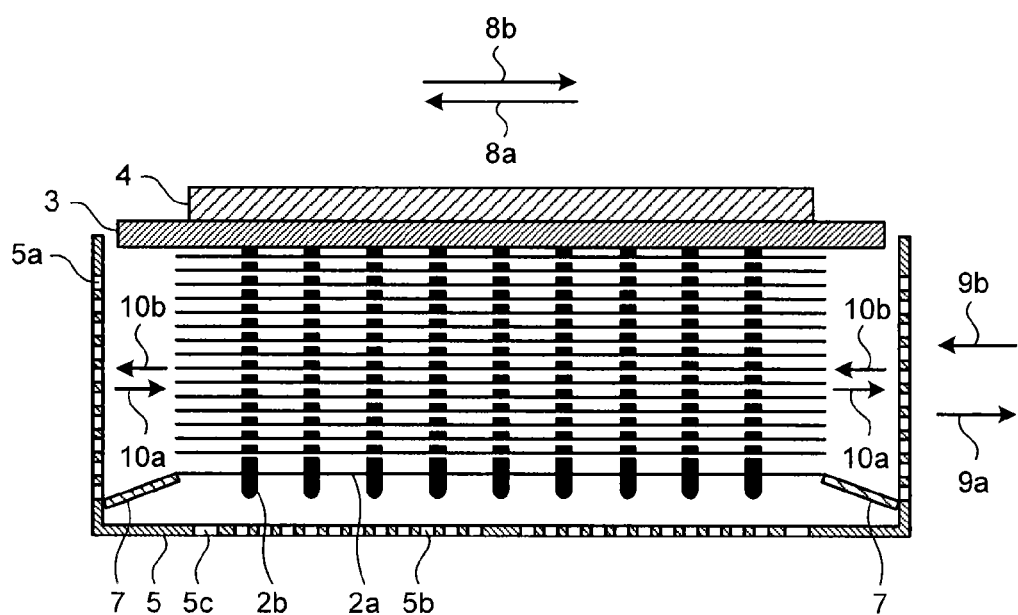
Figures 1, 2:
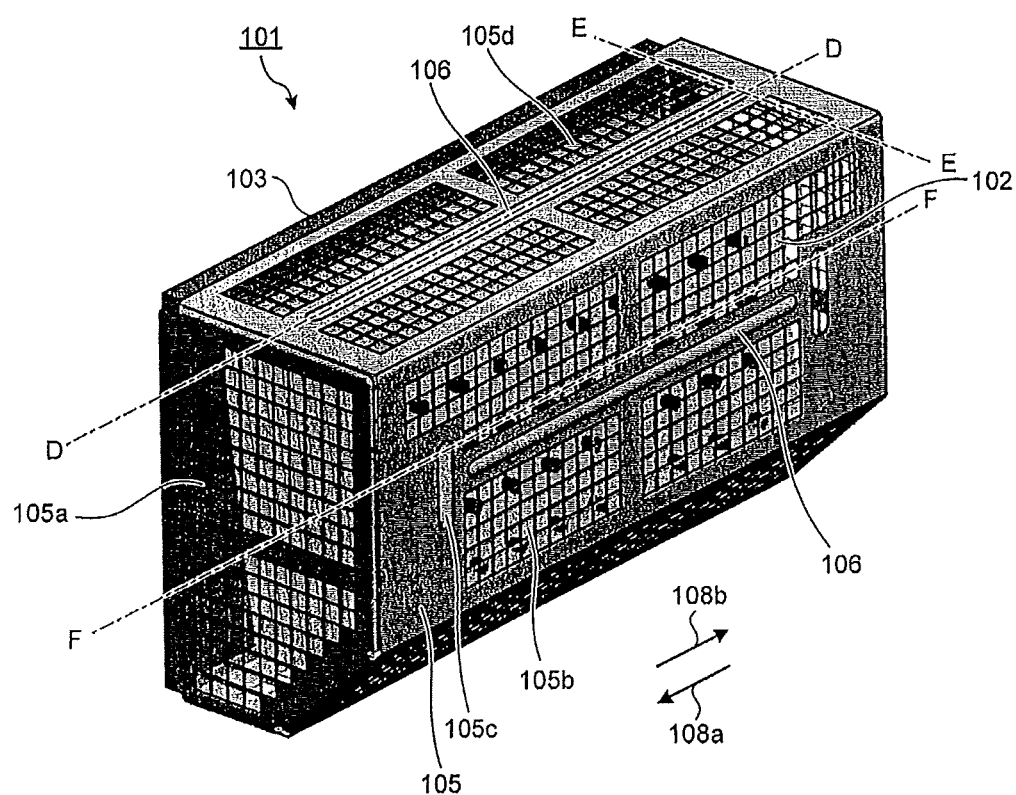
Figure 2:
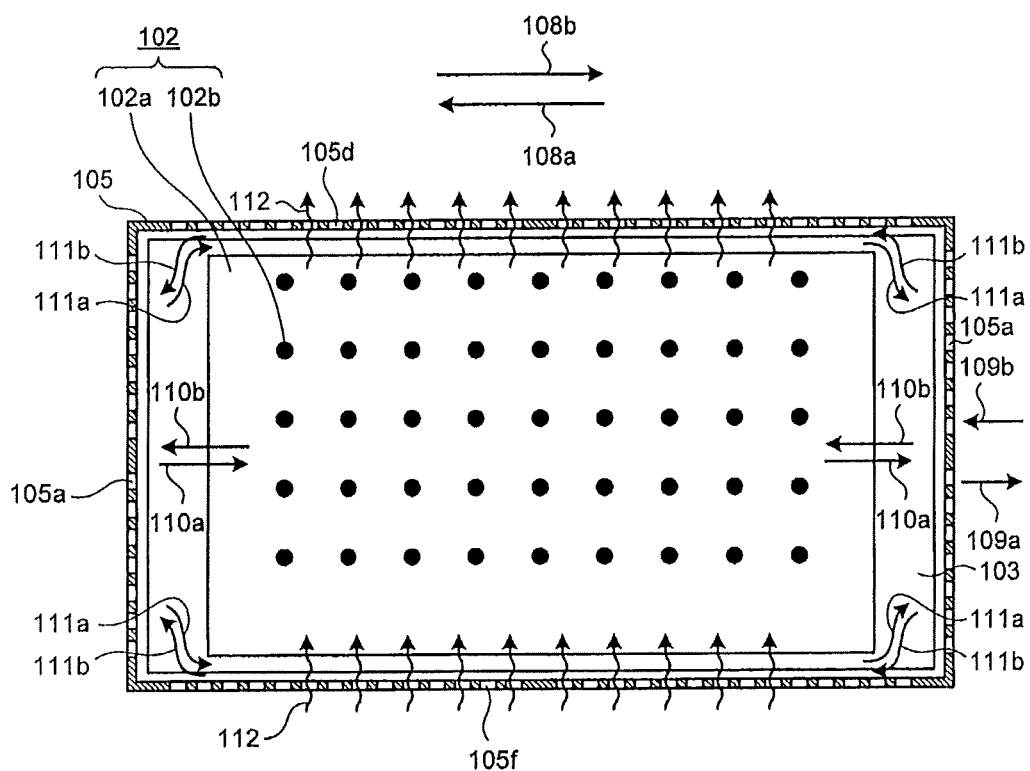
Figures 2, 3:
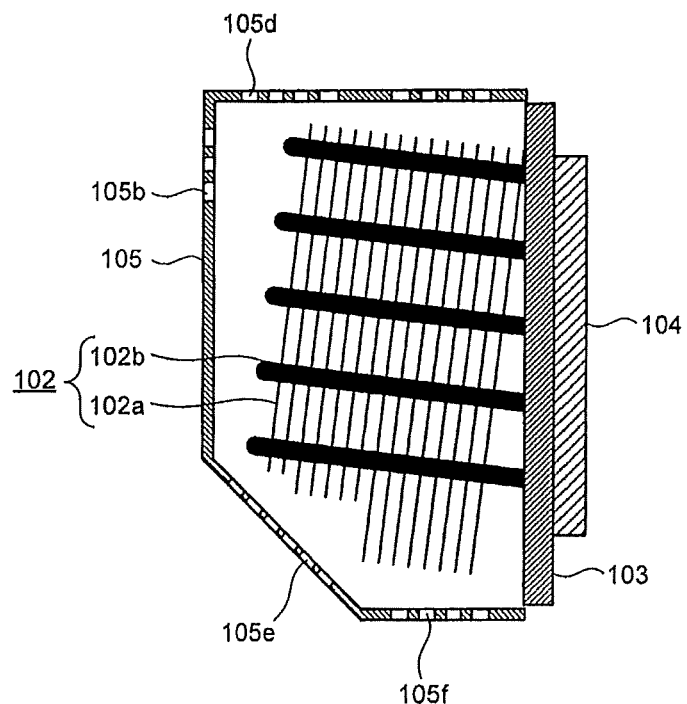
Figures 2, 3, 4:
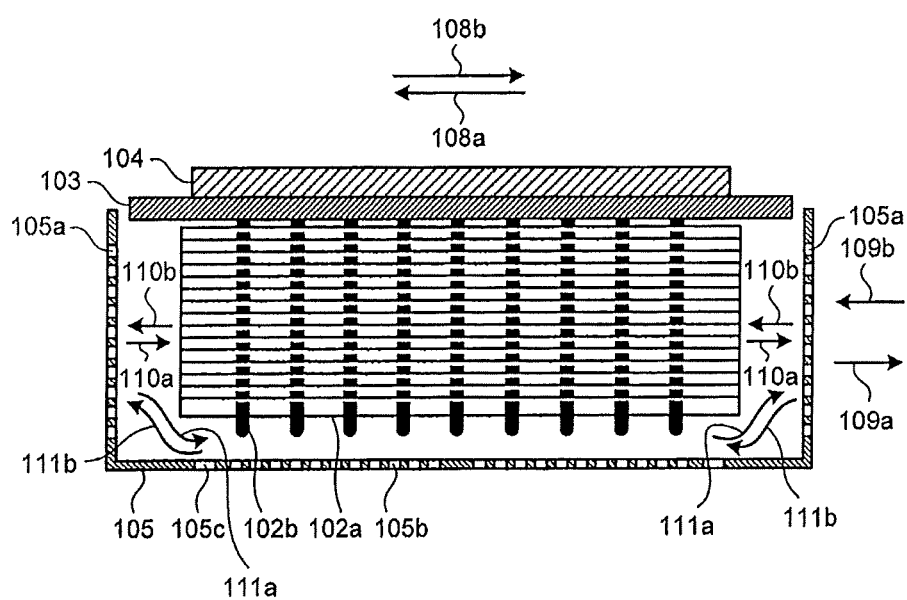
Figures 1, 3:
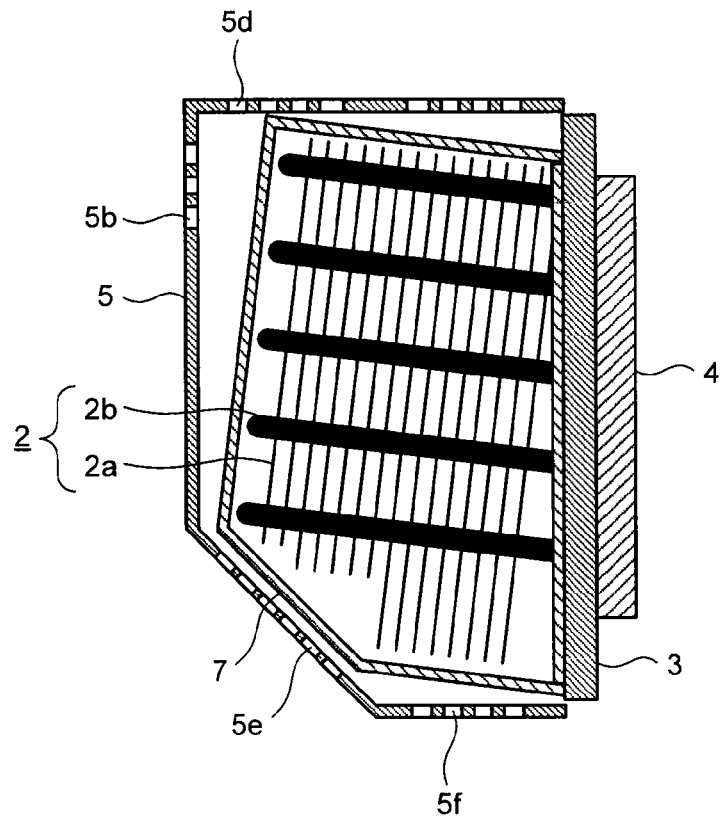
Figures 2, 3:
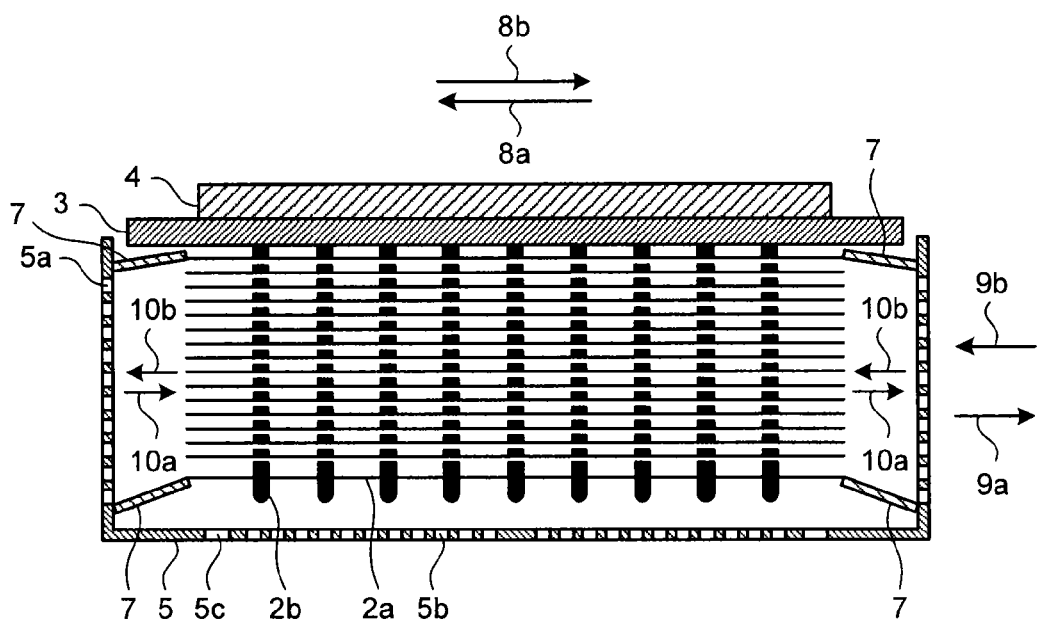
Figures 1, 4:
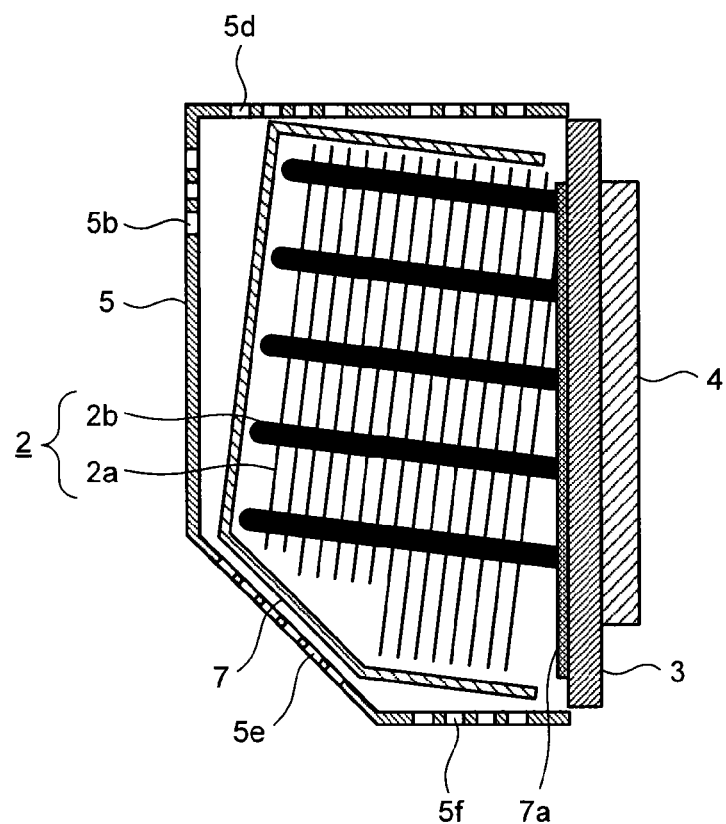
Figures 2, 4:
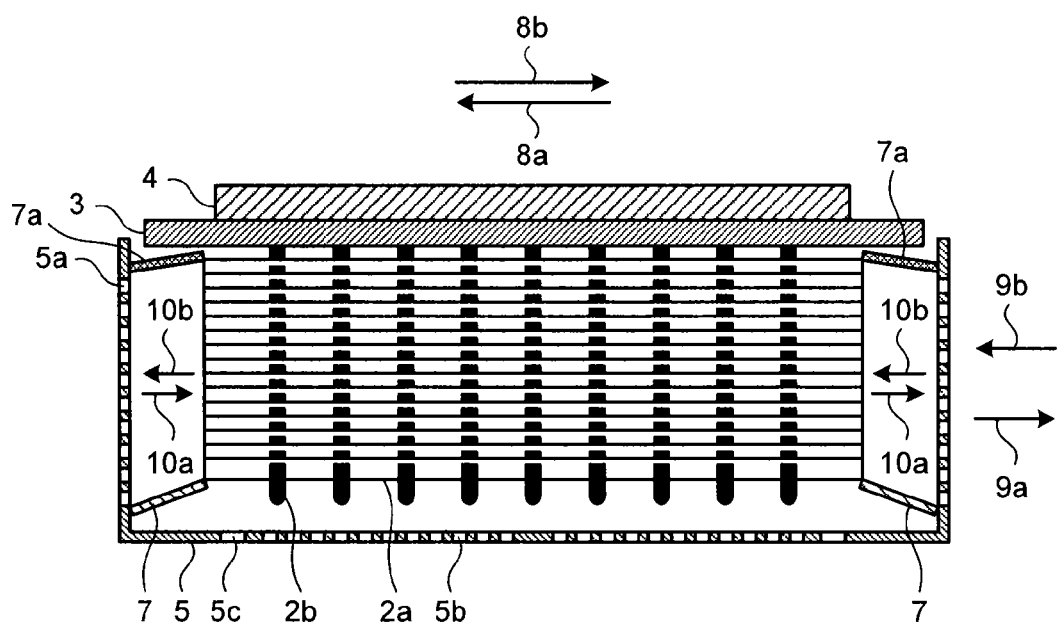

The configuration of a conventional cooling device for an under-floor device for a vehicle is explained here for comparison. FIGS. 2-1 to 2-4 depict a schematic configuration of a conventional cooling device 101 for an under-floor device for a vehicle. FIG. 2-1 is a perspective view (corresponding to FIG. 1-1), FIG. 2-2 is a longitudinal sectional view taken along line D-D in FIG. 2-1 (corresponding to FIG. 1-2), FIG. 2-3 is a longitudinal sectional view taken along line E-E in FIG. 2-1 (corresponding to FIG. 1-3), and FIG. 2-4 is a transverse cross sectional view taken along line F-F in FIG. 2-1 (corresponding to FIG. 1-4).

The structure of the conventional cooling device for an under-floor device for a vehicle is basically the same as that of the cooling device 1 for an under-floor device for a vehicle according to the first embodiment, except that the guide plate 7 is not provided. That is, in FIGS. 2-1 to 2-4, the cooling device 101, fins 102a, heat conducting bars 102b, a cooler 102, a base plate 103, an electronic component 104, and a cover 105 respectively correspond to the cooling device 1, the fins 2a, the heat conducting bars 2b, the cooler 2, the base plate 3, the electronic component 4, and the cover 5 in the cooling device 1 for an under-floor device for a vehicle. Side openings 105a, a front opening 105b, large openings 105c, a top opening 105d, a slant opening 105e, an underside opening 105f, and ribs 106 respectively correspond to the side openings 5a, the front opening 5b, the large openings 5c, the top opening 5d, the slant opening 5e, the underside opening 5f, and the ribs 6 in the cooling device 1 for an under-floor device for a vehicle. A traveling direction 108a, a traveling direction 108b, a traveling wind 109a, a traveling wind 109b, a main flow 110a, and a main flow 110b respectively correspond to the traveling direction 8a, the traveling direction 8b, the traveling wind 9a, the traveling wind 9b, the main flow 10a, and the main flow 10b in the cooling device 1 for an under-floor device for a vehicle.

A cooling operation of the cooling device 101 for an under-floor device for a vehicle configured as described above is explained below. Heat generated in the electronic component 104 is transported to the cooler 102. That is, heat generated in the electronic component 104 is transported to the fins 102a via the base plate 103 and the heat conducting bars 102b. Therefore, the temperature in the cooler 102 is generally higher than the outside air temperature. Because a plurality of fins 102a are formed in the cooler 102, when air (cooling wind) passes through the inside of the cooler 102, heat exchange is performed between the fins 102a and the air.

When the vehicle is traveling, after the cooling wind introduced from the side opening 105a being the inlet is guided to the cooler 102 to cool the fins 102a and the heat conducting bars 102b attached to the base plate 103, the cooling wind is discharged from the side opening 105a being the outlet. When the traveling direction of the vehicle is changed, the flow of the cooling wind also becomes an opposite direction, and the definition of the inlet and the outlet is reversed.

Meanwhile, when the vehicle is stopped, there is no traveling wind. However, in this case, the fins 102a and the heat conducting bars 102b are naturally cooled by a natural wind 112 that is the air passing through the cooler 102 in the cooling device 101 for an under-floor device for a vehicle from the underside opening 105f in the bottom surface of the cover 105 and flowing to the outside from the top opening 105d in the top surface of the cover 105.

Generally, there is a gap between the cover and the cooler due to a tolerance of machining accuracy of the components or the like. In this case, part of a traveling wind 109 (the traveling wind 109a or the traveling wind 109b) introduced into the cooling device 101 for an under-floor device for a vehicle from the side opening 105a being the inlet when the vehicle is traveling becomes a main flow 110 (the main flow 110a or the main flow 110b), which is the cooling wind flowing toward the cooler 102. However, the other part of the traveling wind 109 becomes a bypass flow 111 (a bypass flow 111a or a bypass flow 111b) that is diverted to flow into a gap area between the surfaces connecting the opposite side surfaces of the cover 105 and the cooler 102.

That is, when the traveling direction of the vehicle is the traveling direction 108a, the traveling wind is the traveling wind 109a in the opposite direction to the traveling direction 108a of the vehicle, the cooling wind flowing toward the cooler 102 is the main flow 110a in the opposite direction to the traveling direction 108a of the vehicle, and the bypass flow is the bypass flow 111a flowing in the opposite direction to the traveling direction 108a of the vehicle and diverted to flow to a gap area between the surfaces connecting the opposite side surfaces of the cover 105 and the cooler 102. When the traveling direction of the vehicle is the traveling direction 108b, the traveling wind is the traveling wind 109b in the opposite direction to the traveling direction 108b of the vehicle, the cooling wind flowing toward the cooler 102 is the main flow 110b in the opposite direction to the traveling direction 108b of the vehicle, and the bypass flow is the bypass flow 111b flowing in the opposite direction to the traveling direction 108b of the vehicle and diverted to flow to a gap area between the surfaces connecting the opposite side surfaces of the cover 105 and the cooler 102. Arrow directions in FIGS. 2-1 to 2-4 indicate flow directions of the respective winds.

When such bypass flows are generated, the air volume of the cooling wind decreases; therefore, the cooling performance for cooling the fins 102a and the heat conducting bars 102b deteriorates.

However, in the cooling device 1 for an under-floor device for a vehicle according to the first embodiment, by providing the guide plate 7 described above, generation of a bypass flow diverted to flow to the gap area between the surfaces connecting the opposite side surfaces of the cover 5 and the cooler 2 can be suppressed or prevented. Most of the traveling wind taken in from the side opening 5a when the vehicle is traveling flows to the cooler 2 without being diverted to the gap area between the surfaces connecting the opposite side surfaces of the cover 5 and the cooler 2; therefore, the air volume of the cooling wind increases. Accordingly, the electronic component 4 can be efficiently cooled by efficiently cooling the fins 2a and the heat conducting bars 2b.

Therefore, according to the cooling device 1 for an under-floor device for a vehicle according to the first embodiment, a traveling wind can be efficiently taken into the cooler 2 installed under the floor of the vehicle, and thus the electronic component 4 can be efficiently cooled both when the vehicle is traveling and when the vehicle is stopped.

Second Embodiment

In a second embodiment, a modification of the cooling device 1 for an under-floor device for a vehicle according to the first embodiment is explained. In a cooling device for an under-floor device for a vehicle according to the second embodiment, only the shape of the guide plate 7 is different from that of the cooling device 1 for an under-floor device for a vehicle according to the first embodiment. Therefore, only the guide plate 7 is explained, and explanations of other parts will be omitted. FIGS. 3-1 and 3-2 depict a schematic configuration of the cooling device for an under-floor device for a vehicle according to the second embodiment of the present invention. FIG. 3-1 is a longitudinal sectional view corresponding to FIG. 1-3, and FIG. 3-2 is a transverse cross sectional view corresponding to FIG. 1-4.

In the cooling device for an under-floor device for a vehicle according to the second embodiment, the guide plate 7 having a substantially rectangular frame shape is attached so as to block all directions including the base plate 3 side in the surface (see FIG. 3-1) vertical to the traveling direction (the traveling direction 8a or the traveling direction 8b) of the vehicle of the gap area between the cover 5 and the cooler 2 and the gap area between the base plate 3 and the cooler 2. That is, the guide plate 7 has a substantially rectangular frame shape arranged on the top side, the front surface side, the bottom side, and the rear surface side of the side gap area. One end of the guide plate 7 on the cooler 2 side is connected to near the corner portion on the side opening 5a side of the outer peripheral portion of the cooler 2. The other end on the side surface side of the guide plate 7 is connected to the side surface of the cover 5 such that the side opening 5a is surrounded along the outermost periphery of the side opening 5a on the side surface in order to use the traveling wind efficiently. The guide plate 7 as described above linearly connects between the side surface of the cover 5 and the cooler 2 and has a shape that does not completely cover the cooler 2 in the traveling direction (the traveling direction 8a or the traveling direction 8b) of the vehicle.

In manufacturing the cooling device for an under-floor device for a vehicle, the guide plate 7 having such a configuration can be attached to the fins 2a beforehand and then the cover 5 can be fixed so as to cover the cooler 2, thereby facilitating attachment thereof. By having a structure in which the guide plate 7 is fixed to the fins 2a beforehand, it is possible to obtain a structure in which there is no gap between the cooler 2 and the guide plate 7, thereby enabling the traveling wind to be efficiently guided.

In the cooling device for an under-floor device for a vehicle according to the second embodiment including the guide plate 7 as described above, in the side gap area between the side surface of the cover 5 and the cooler 2, by blocking all directions (the entire perimeter) including the base plate 3 side in the plane vertical to the traveling direction of the vehicle, all the traveling wind taken in from the side opening 5a when the vehicle is traveling flows to the cooler 2 without being diverted to the gap area between the cooler 2 and the cover 5 and the gap area between the base plate 3 and the cooler 2. Accordingly, the air volume of the cooling wind further increases as compared to the cooling device 1 for an under-floor device for a vehicle according to the first embodiment.

Therefore, according to the cooling device for an under-floor device for a vehicle of the second embodiment, the electronic component 4 can be further efficiently cooled.

Third Embodiment

In a third embodiment, a modification of the cooling device 1 for an under-floor device for a vehicle according to the first embodiment is explained. In a cooling device for an under-floor device for a vehicle according to the third embodiment, only the shape of the guide plate 7 is different from that of the cooling device 1 for an under-floor device for a vehicle according to the first embodiment. Therefore, only the guide plate 7 is explained, and explanations of other parts will be omitted. FIGS. 4-1 and 4-2 depict a schematic configuration of the cooling device for an under-floor device for a vehicle according to the third embodiment of the present invention. FIG. 4-1 is a longitudinal sectional view corresponding to FIG. 1-3, and FIG. 4-2 is a transverse cross sectional view corresponding to FIG. 1-4.

In the cooling device for an under-floor device for a vehicle according to the third embodiment, in the side gap area between the side surface of the cover 5 and the cooler 2, the guide plate 7 having a substantially C-shape explained in the first embodiment is provided and an auxiliary guide plate 7a is further attached. The auxiliary guide plate 7a is attached to block the gap area between the base plate 3 and the cooler 2. The guide plate 7 and the auxiliary guide plate 7a linearly connect between the side surface of the cover 5 and the cooler 2, and have a shape that does not completely cover the cooler 2 in the traveling direction (the traveling direction 8a or the traveling direction 8b) of the vehicle.

In manufacturing the cooling device for an under-floor device for a vehicle, such a configuration can be formed by attaching the guide plate 7 to the cover 5 beforehand and attaching the auxiliary guide plate 7a to the base plate 3 or the cooler 2 beforehand, and then, fixing the cover 5 so as to cover the cooler 2, thereby facilitating manufacturing thereof.

In the cooling device for an under-floor device for a vehicle according to the third embodiment including the guide plate 7 and the auxiliary guide plate 7a as described above, in the side gap area between the side surface of the cover 5 and the cooler 2, by blocking all directions (the entire perimeter) including the base plate 3 side in the plane vertical to the traveling direction of the vehicle, all the traveling wind taken in from the side opening 5a when the vehicle is traveling flows to the cooler 2 without being diverted to the gap area between the cooler 2 and the cover 5 and the gap area between the base plate 3 and the cooler 2. Accordingly, the air volume of the cooling wind further increases as compared to the cooling device 1 for an under-floor device for a vehicle according to the first embodiment.

Therefore, according to the cooling device for an under-floor device for a vehicle of the third embodiment, the electronic component 4 can be further efficiently cooled.

A gap is generated between the guide plate 7 having a substantially C-shape and the auxiliary guide plate 7a due to a tolerance of machining accuracy of components or the like, and it is preferable to reduce the gap as much as possible and is further preferable to eliminate the gap.

Fourth Embodiment

Figures 1, 5:
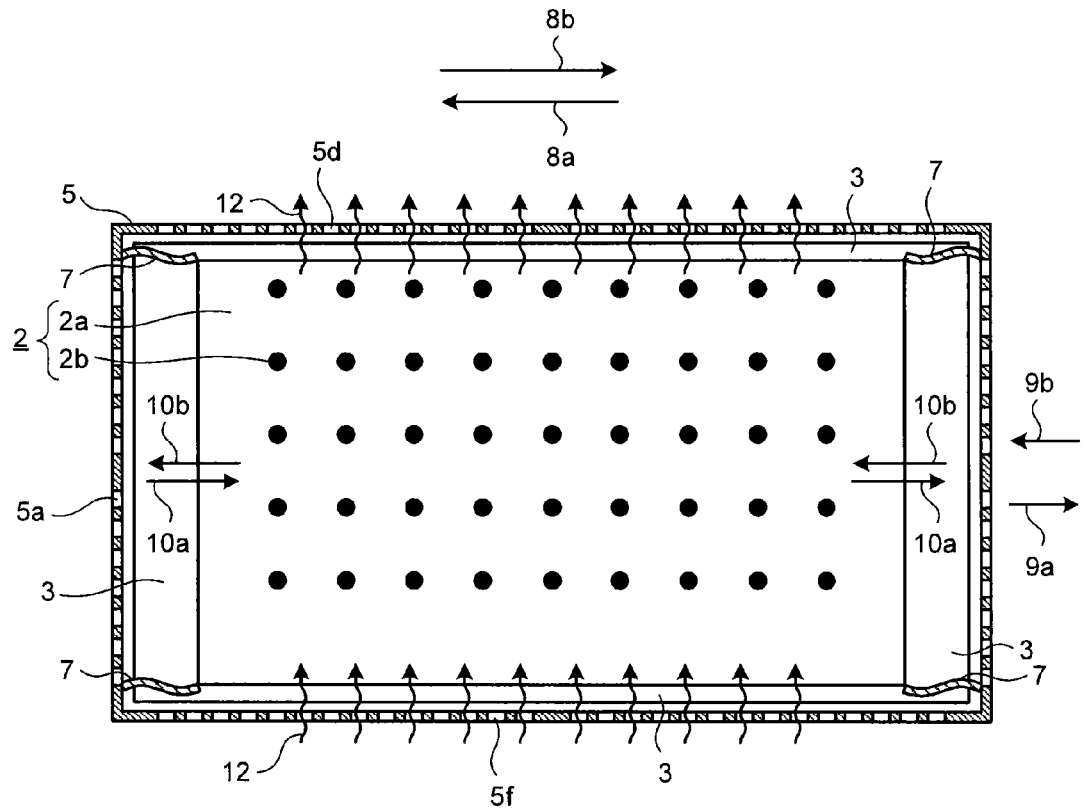
Figures 2, 5:
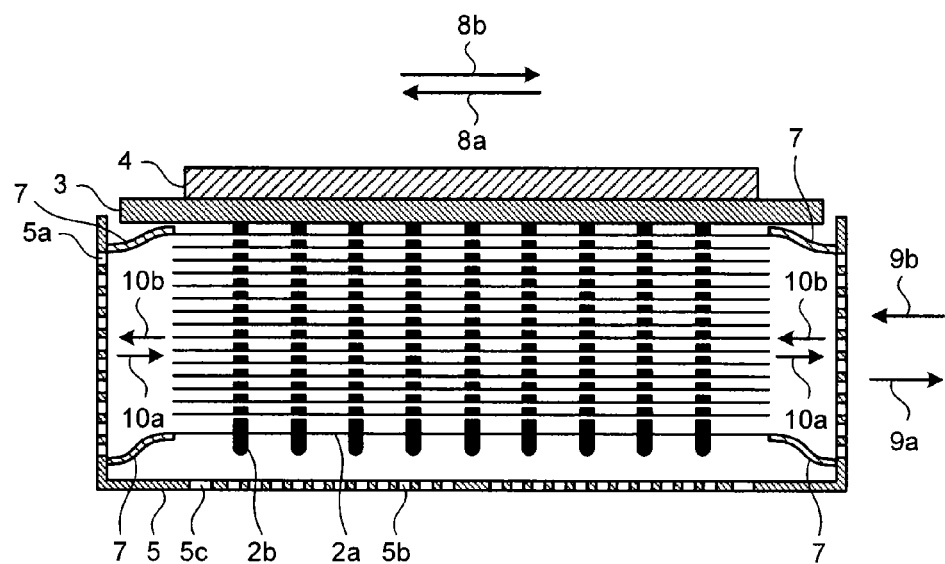

In a fourth embodiment, a modification of the cooling devices for an under-floor device for a vehicle according to the first to third embodiments is explained. In a cooling device for an under-floor device for a vehicle according to the fourth embodiment, only the shape of the guide plate 7 is different from those of the cooling devices for an under-floor device for a vehicle according to the first to third embodiments. Therefore, only the guide plate 7 is explained, and explanations of other parts will be omitted. FIGS. 5-1 and 5-2 depict a schematic configuration of the cooling device for an under-floor device for a vehicle according to the fourth embodiment of the present invention. FIG. 5-1 is a longitudinal sectional view corresponding to FIG. 1-2, and FIG. 5-2 is a transverse cross sectional view corresponding to FIG. 1-4. In FIGS. 5-1 and 5-2, a modification of the second embodiment is shown.

In the cooling device for an under-floor device for a vehicle according to the fourth embodiment, the guide plate 7 connects between the side surface of the cover 5 and the cooler 2 in a gradually curved manner and has a shape that does not completely cover the cooler 2 in the traveling direction (the traveling direction 8a or the traveling direction 8b) of the vehicle. According to such a structure, a flow of the traveling wind (cooling wind) between the side opening 5a and the cooler 2 can be gradually changed, and effects of suppressing detachment of the guide plate 7 and suppressing a pressure loss can be obtained.

Therefore, according to the cooling device for an under-floor device for a vehicle according to the fourth embodiment, the electronic component 4 can be efficiently cooled and effects of suppressing detachment of the guide plate 7 and the auxiliary guide plate 7a and suppressing a pressure loss can be obtained.

FIGS. 5-1 and 5-2 depict a modification of the second embodiment. However, the modification is also applicable in a similar manner to the guide plate 7 and the auxiliary guide plate 7a in the first and third embodiments. That is, the shape for connecting between the side surface of the cover 5 and the cooler 2 in a gradually curved manner is applicable to any of the guide plate 7 having a substantially C-shape as in the first embodiment, the guide plate 7 having a substantially rectangular frame shape as in the second embodiment, and the guide plate 7 having a substantially C-shape and the auxiliary guide plate 7a as in the third embodiment.

Fifth Embodiment

Figure 6:
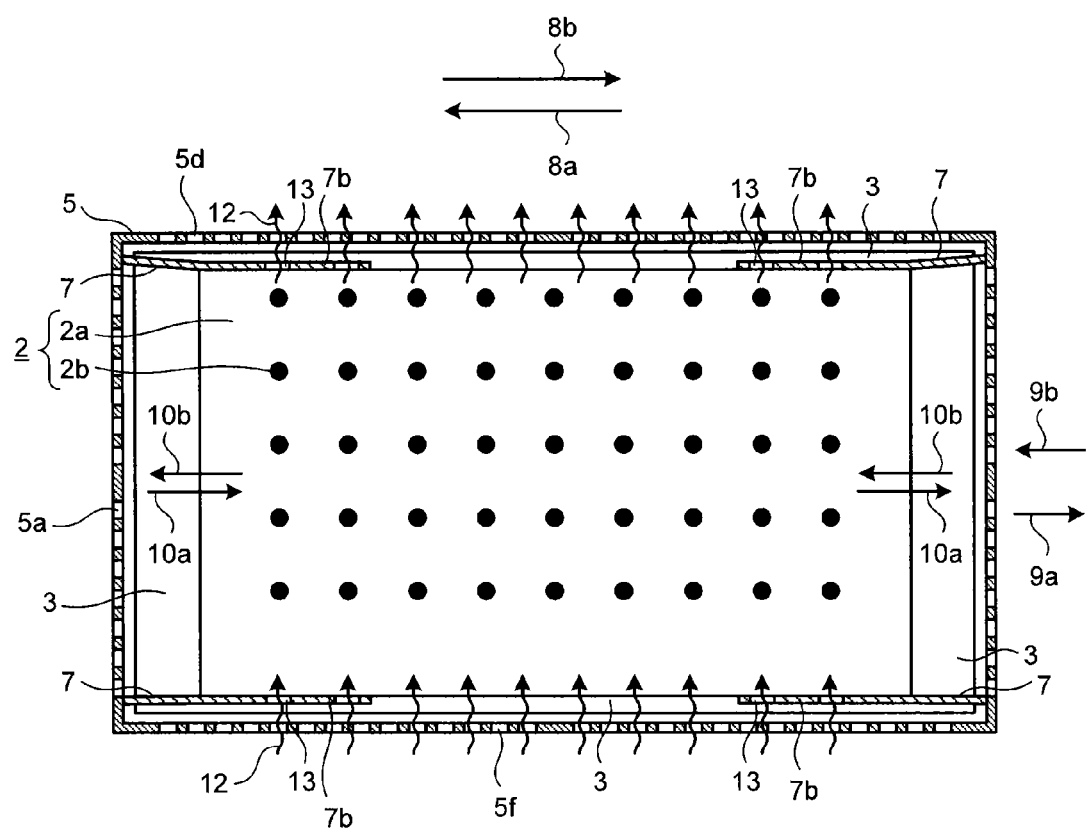
FIG. 6 is a longitudinal sectional view corresponding to FIG. 1-2, depicting a schematic configuration of a cooling device for an under-floor device for a vehicle according to a fifth embodiment of the present invention.

In a fifth embodiment, a modification of the cooling devices for an under-floor device for a vehicle according to the first to third embodiments is explained. In a cooling device for an under-floor device for a vehicle according to the fifth embodiment, only the shape of the guide plate 7 is different from those of the cooling devices for an under-floor device for a vehicle according to the first to third embodiments. Therefore, only the guide plate 7 is explained, and explanations of other parts will be omitted. FIG. 6 is a longitudinal sectional view corresponding to FIG. 1-2, depicting a schematic configuration of the cooling device for an under-floor device for a vehicle according to the fifth embodiment of the present invention. In FIG. 6, a modification of the second embodiment is shown.

In the cooling device for an under-floor device for a vehicle according to the fifth embodiment, the guide plate 7 has an extending portion 7b that extend from the side gap area between the side surface of the cover 5 and the cooler 2 and substantially covers the outer peripheral surface of the fins 2a of the cooler 2 along the traveling direction of the vehicle. The extending portion 7b has a shape covering part of the outer peripheral surface of the fins 2a. In the extending portion 7b, a hole 13 or a slit as an opening is provided in a portion along three surfaces except the front surface side of the cooler 2, depending on the length (the traveling direction of the train) of the guide plate 7 covering the outer peripheral surface of the fins 2a.

Generally, part of the cooling wind when the vehicle is traveling comes out from the upper side or the lower side of the cooler 2. On the other hand, according to this structure, generation of the cooling wind coming out from the upper side, the lower side, or the front surface side of the cooler 2 can be suppressed, and thus the electronic component 4 can be cooled more efficiently.

By providing the hole 13 or the slit in the portion of the guide plate 7 along the three surfaces except the front surface side of the cooler 2, the guide plate 7 does not block the airflow flowing from the bottom surface of the cooler 2 to the top surface of the cooler 2, and natural cooling of the cooler 2 by the natural wind 12 when the vehicle is stopped is not hindered. Accordingly, the guide plate 7 does not reduce the cooling capacity when the vehicle is stopped. When the extending portion 7b covers the length that does not obstruct natural cooling of the cooler 2 by the natural wind 12, or when there is sufficient cooling capacity even when natural cooling is obstructed, the hole 13 or the like does not need to be provided.

Therefore, according to the cooling device for an under-floor device for a vehicle of the fifth embodiment, the electronic component 4 can be further efficiently cooled.

The modification of the second embodiment is shown in FIG. 6. However, the extending portion 7b can be applied to the first and third embodiments. However, because the cooling wind does not come out from the base plate 3 side of the cooler 2, the extending portion 7b is not required in the guide plate 7 and the auxiliary guide plate 7a on the base plate 3 side.

Sixth Embodiment

Figure 7:
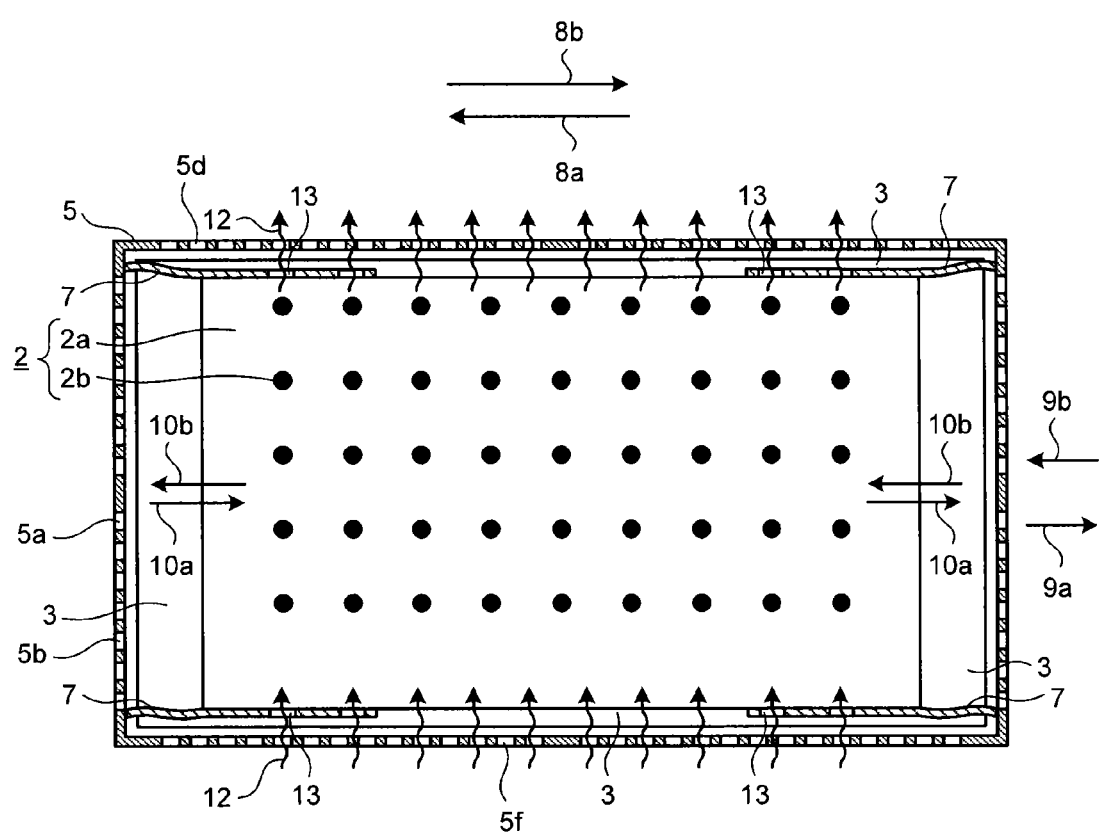
FIG. 7 is a longitudinal sectional view corresponding to FIG. 1-2, depicting a schematic configuration of a cooling device for an under-floor device for a vehicle according to a sixth embodiment of the present invention.

In a sixth embodiment, a modification of the cooling device for an under-floor device for a vehicle according to the fifth embodiment is explained. In a cooling device for an under-floor device for a vehicle according to the sixth embodiment, only the shape of the guide plate 7 is different from that of the cooling device for an under-floor device for a vehicle according to the fifth embodiment. Therefore, only the guide plate 7 is explained, and explanations of other parts will be omitted. FIG. 7 is a longitudinal sectional view corresponding to FIG. 1-2, depicting a schematic configuration of the cooling device for an under-floor device for a vehicle according to the sixth embodiment of the present invention.

In the cooling device for an under-floor device for a vehicle according to the sixth embodiment, the guide plate 7 has a shape connecting between the side surface of the cover 5 and the cooler 2 in a gradually curved manner. According to such a structure, a flow of the traveling wind (cooling wind) between the side opening 5a and the cooler 2 can be gradually changed, and effects of suppressing detachment of the guide plate 7 and suppressing a pressure loss can be obtained.

Therefore, according to the cooling device for an under-floor device for a vehicle according to the sixth embodiment, the electronic component 4 can be further efficiently cooled and effects of suppressing detachment of the guide plate 7 and the auxiliary guide plate 7a and suppressing a pressure loss can be obtained.

The guide plate 7 can be formed in a substantially C-shape as in the first embodiment, can be formed in a substantially rectangular frame shape as in the second embodiment, or can be formed of the guide plate 7 having a substantially C-shape and the auxiliary guide plate 7a as in the third embodiment.

While the embodiments of the present invention have been explained above, the embodiments are only exemplary and the present invention can adopt various other modes. For example, the shape of the cover 5 indicated in the embodiments is an example only. As the shape of the cover 5, for example, a form in which mesh openings are arranged irregularly, a form in which the shape of the openings are not rectangular but are circular, and a form in which the number of holes provided in the guide plate 7 is increased from that shown in the drawings can be used.

The electronic component 4 described above is an example only as the member to be cooled, which is an object to be cooled by the cooler 2. The member to be cooled can be a heat generating component other than the electronic component or can be a non-heat generating component to be cooled, and the shape of the member to be cooled is not particularly limited.

The guide plate 7 can be attached to anywhere, such as the fins 2a and the base plate 3, as long as the guide plate 7 can be fixed. The guide plate 7 can be fixed by a fastener component, such as a screw, a bolt, or a rivet, can be fixed by using an adhesive, or can be fixed by welding.

The number of the fins 2a in the cooler 2 can be any number as long as sufficient cooling capacity can be obtained. The height (size) of the fins 2a can be all the same or can be changed stepwise in the arrangement direction.

Heat pipes can be used instead of the heat conducting bars 2b, and either one of the heat pipes and the heat conducting bars 2b can be used, or both of these can be mixed and used. The arrangement of the heat pipes and the heat conducting bars 2b can be regular or irregular.

Figures 1, 9:
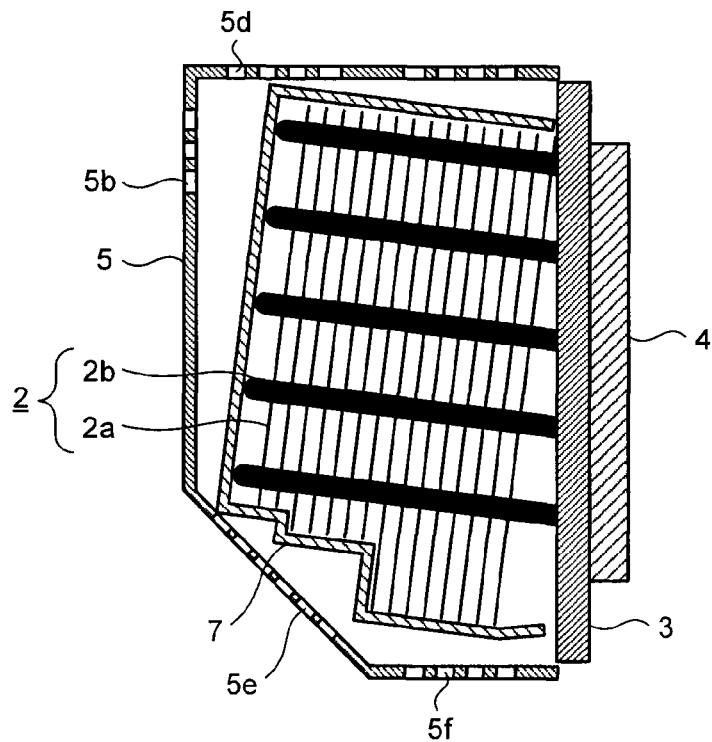
Figures 2, 9:
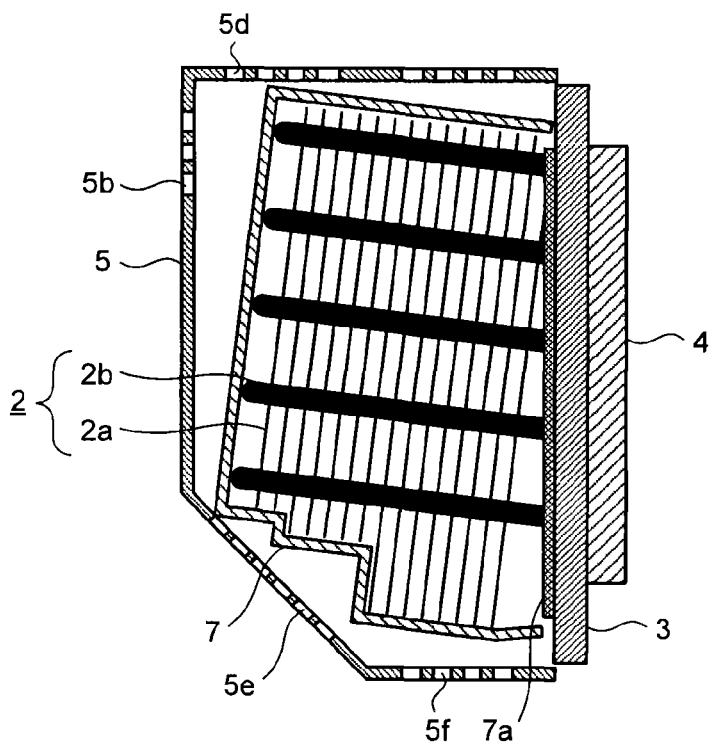

In the first to sixth embodiments described above, the shape of the guide plate 7 in the plane direction vertical to the traveling direction of the vehicle is a shape substantially along the external shape of the cooler 2. However, for example, as shown in FIGS. 8-1 and 8-2, the guide plate 7 can be arranged in a simplified manner in a shape substantially along the external shape of the cover 5 while covering the fins 2a, or can be a shape substantially further along the external shape of the cooler 2 as shown in FIGS. 9-1 and 9-2. FIGS. 8-1 and 8-2 are longitudinal sectional views corresponding to FIG. 1-3, depicting a modification of the guide plate 7. FIG. 8-1 depicts a case where the auxiliary guide plate 7a is not provided, and FIG. 8-2 depicts a case where the auxiliary guide plate 7a is provided. FIGS. 9-1 and 9-2 are longitudinal sectional views corresponding to FIG. 1-3, depicting a modification of the guide plate 7. FIG. 9-1 depicts a case where the auxiliary guide plate 7a is not provided, and FIG. 9-2 depicts a case where the auxiliary guide plate 7a is provided.

Furthermore, in any of the above embodiments, it is preferable that there is no gap between the guide plate 7 and the fins 2a, the heat conducting bars 2b, or the cover 5. However, there may be a gap up to substantially a fin pitch.

INDUSTRIAL APPLICABILITY

As described above, the cooling device for an under-floor device for a vehicle according to the present invention is useful for realizing highly efficient cooling of a member to be cooled installed under a floor of a vehicle.

REFERENCE SIGNS LIST 1 cooling device, 2 cooler, 2a fin, 2b heat conducting bar, 3 base plate, 4 electronic component, 5 cover, 5a side opening, 5b front opening, 5c large opening, 5d top opening, 5e slant opening, 5f underside opening, 6 rib, 7 guide plate, 7a auxiliary guide plate, 7b extending portion, 8a traveling direction, 8b traveling direction, 9 traveling wind, 9a traveling wind, 9b traveling wind, 10 main flow, 10a main flow, 10b main flow, 12 natural wind, 13 hole, 101 cooling device, 102a fin, 102b heat conducting bar, 102 cooler, 103 base plate, 104 electronic component, 105 cover, 105a side opening, 105b front opening, 105c large opening, 105d top opening, 105e slant opening, 105f underside opening, 106 rib, 108a traveling direction, 108b traveling direction, 109 traveling wind, 109a traveling wind, 109b traveling wind, 110 main flow, 110a main flow, 110b main flow, 111 bypass flow, 111a bypass flow, 111b bypass flow, 112 natural wind.

The invention claimed is:

1. A cooling device for an under-floor device that is arranged under a floor of a vehicle and that cools the under-floor device by using a vehicular travel airflow generated by traveling of the vehicle, the device comprising:
   a base plate to a rear surface side of which the under-floor device is attached;
   a heat radiating unit that is attached to a front surface side of the base plate and radiates heat conducted from the under-floor device via the base plate;
   a cover that surrounds the heat radiating unit and includes a first side surface that is perpendicular to the base plate, a second side surface that is also perpendicular to the base plate and arranged on an opposite side of the cover from the first side surface, and additional surfaces that connect the first side surface to the second side surface, the first side surface includes at least one first side opening capable of causing the vehicular travel airflow to flow into the cover through the first side surface, and the second side surface includes at least one second side opening causing the vehicular travel airflow to flow out from the cover; and
   a guide plate positioned to guide the vehicular travel airflow flowing in from the at least one first side opening to the heat radiating unit by blocking at least part of a gap area between at least one of the additional surfaces and the heat radiating unit, the guide plate being provided in a side gap area between the first side surface and the heat radiating unit, and the guide plate being directly attached to the first side surface.

2. The cooling device for an under-floor device for a vehicle according to claim 1, wherein the guide plate is arranged to block an area of the gap area excluding a rear surface side in a plane vertical to the traveling direction.

3. The cooling device for an under-floor device for a vehicle according to claim 2, wherein the guide plate has a C-shape arranged on a front surface side and on sides in two directions intersecting with the front surface side of the side gap area.

4. The cooling device for an under-floor device for a vehicle according to claim 3, wherein an end of the guide plate on a side of the side surface is arranged to surround the side opening along a direction excluding a rear surface side of an outermost periphery of the side opening in the side surface.

5. The cooling device for an under-floor device for a vehicle according to claim 1, wherein the guide plate is arranged to block all areas of the gap area in a plane vertical to the traveling direction.

6. The cooling device for an under-floor device for a vehicle according to claim 5, wherein the guide plate has a rectangular frame shape arranged on a front surface side, a rear surface side, and sides in two directions intersecting with the front surface side of the side gap area.

7. The cooling device for an under-floor device for a vehicle according to claim 6, wherein an end of the guide plate on a side of the side surface is arranged to surround the side opening along an outermost periphery of the side opening in the side surface.

8. The cooling device for an under-floor device for a vehicle according to claim 1, wherein the guide plate includes an extending portion provided to cover part of a surface of the heat radiating unit along the traveling direction, and the extending portion has an opening in part thereof.

9. The cooling device for an under-floor device for a vehicle according to claim 1, wherein the guide plate is formed to have a gradually curved shape.

10. The cooling device for an under-floor device for a vehicle according to claim 1, wherein the cover includes a top surface, a surface on a front surface side, and a bottom surface as surfaces connecting the opposite side surfaces, and includes an air-flow opening in each of the top surface and the bottom surface, and in the side gap area that is on a side of the side surface with respect to an outer peripheral surface of the heat radiating unit facing the side surface of the cover inside the cover, the guide plate guides a traveling wind flowing in from the side opening to the heat radiating unit by blocking at least part of a gap area between the top surface of the cover and the heat radiating unit, at least part of a gap area between the bottom surface and the heat radiating unit, and at least part of a gap area between the surface on the front surface side and the heat radiating unit, and has a shape that does not completely cover upper and lower portions of the heat radiating unit in the traveling direction or a shape that partially covers the outer peripheral surface of the heat radiating unit.

11. The cooling device for an under-floor device for a vehicle according to claim 10, wherein the guide plate is connected to a corner portion on a side of the side opening in the outer peripheral portion of the heat radiating unit.

12. The cooling device for an under-floor device for a vehicle according to claim 10, wherein the guide plate is connected to the side surface of the cover to surround the side opening.

* * * * *